United States Patent
Slesazeck

(10) Patent No.: US 7,688,660 B2
(45) Date of Patent: Mar. 30, 2010

(54) SEMICONDUCTOR DEVICE, AN ELECTRONIC DEVICE AND A METHOD FOR OPERATING THE SAME

(75) Inventor: Stefan Slesazeck, Dresden (DE)

(73) Assignee: Qimonda AG, Munich (DE)

( * ) Notice: Subject to any disclaimer, the term of this patent is extended or adjusted under 35 U.S.C. 154(b) by 234 days.

(21) Appl. No.: 11/734,433

(22) Filed: Apr. 12, 2007

(65) Prior Publication Data

US 2008/0253179 A1 Oct. 16, 2008

(51) Int. Cl.
*G11C 7/00* (2006.01)

(52) U.S. Cl. .................................. 365/222; 365/176

(58) Field of Classification Search ................. 365/222, 365/176, 174
See application file for complete search history.

(56) References Cited

U.S. PATENT DOCUMENTS

| | | | |
|---|---|---|---|
| 5,822,264 A | 10/1998 | Tomishima et al. | |
| 5,877,978 A | 3/1999 | Morishita et al. | |
| 6,081,443 A * | 6/2000 | Morishita et al. | ............ 365/149 |
| 7,085,156 B2 * | 8/2006 | Ferrant et al. | ................ 365/174 |
| 2005/0128885 A1 | 6/2005 | Huang et al. | |
| 2006/0126374 A1 | 6/2006 | Waller et al. | |
| 2006/0131650 A1 | 6/2006 | Okhonin et al. | |
| 2006/0279985 A1 | 12/2006 | Keshavarzi et al. | |
| 2007/0058427 A1 | 3/2007 | Okhonin et al. | |

* cited by examiner

*Primary Examiner*—Vu A Le
(74) *Attorney, Agent, or Firm*—Edell, Shapiro & Finnan, LLC

(57) ABSTRACT

A semiconductor memory device includes circuitry coupled to a plurality of memory cells with transistors. The circuitry is configured to change a potential of a body of the transistor to a degree depending on a charging state of the body. A gate electrode of the transistor is maintained in a non-addressed state.

22 Claims, 8 Drawing Sheets

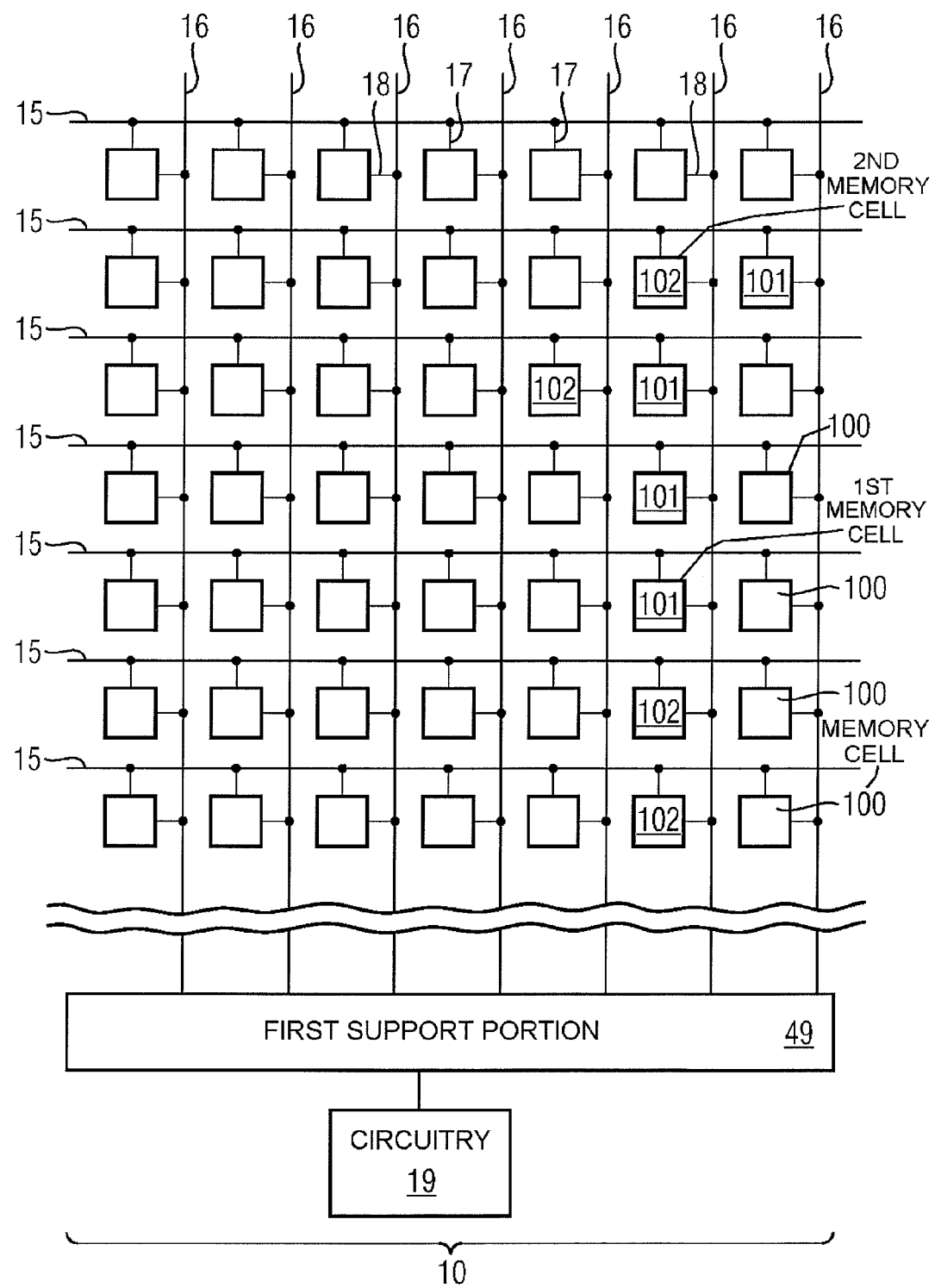

FIG 1B
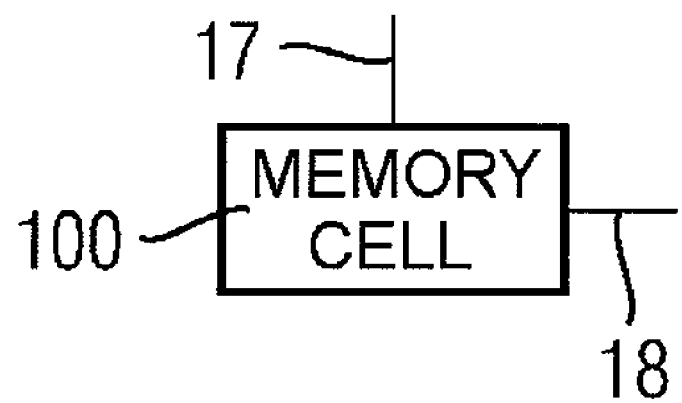
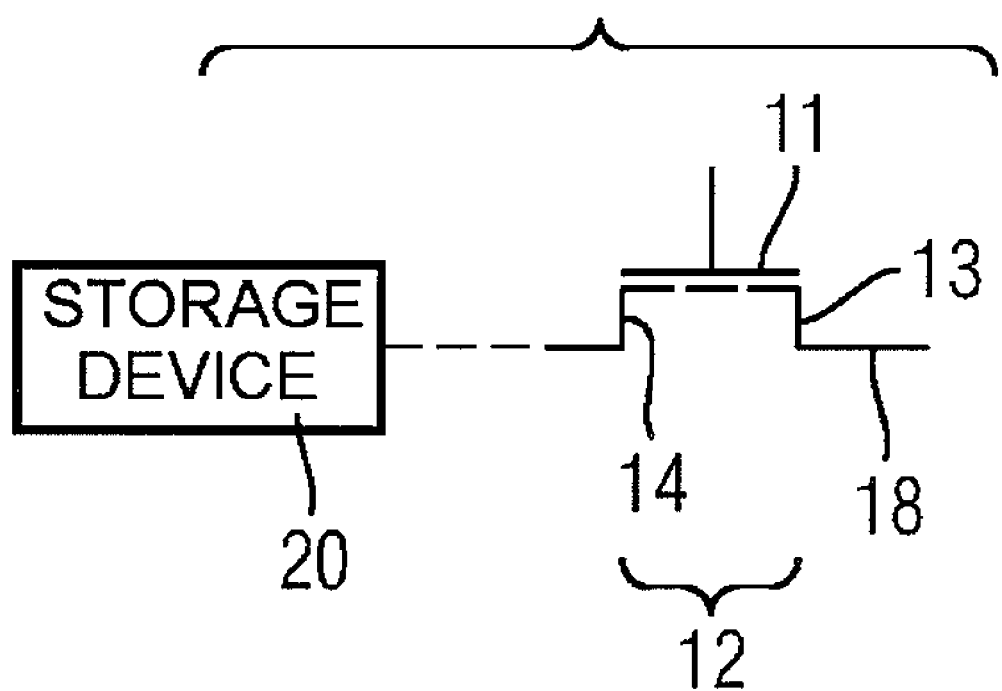

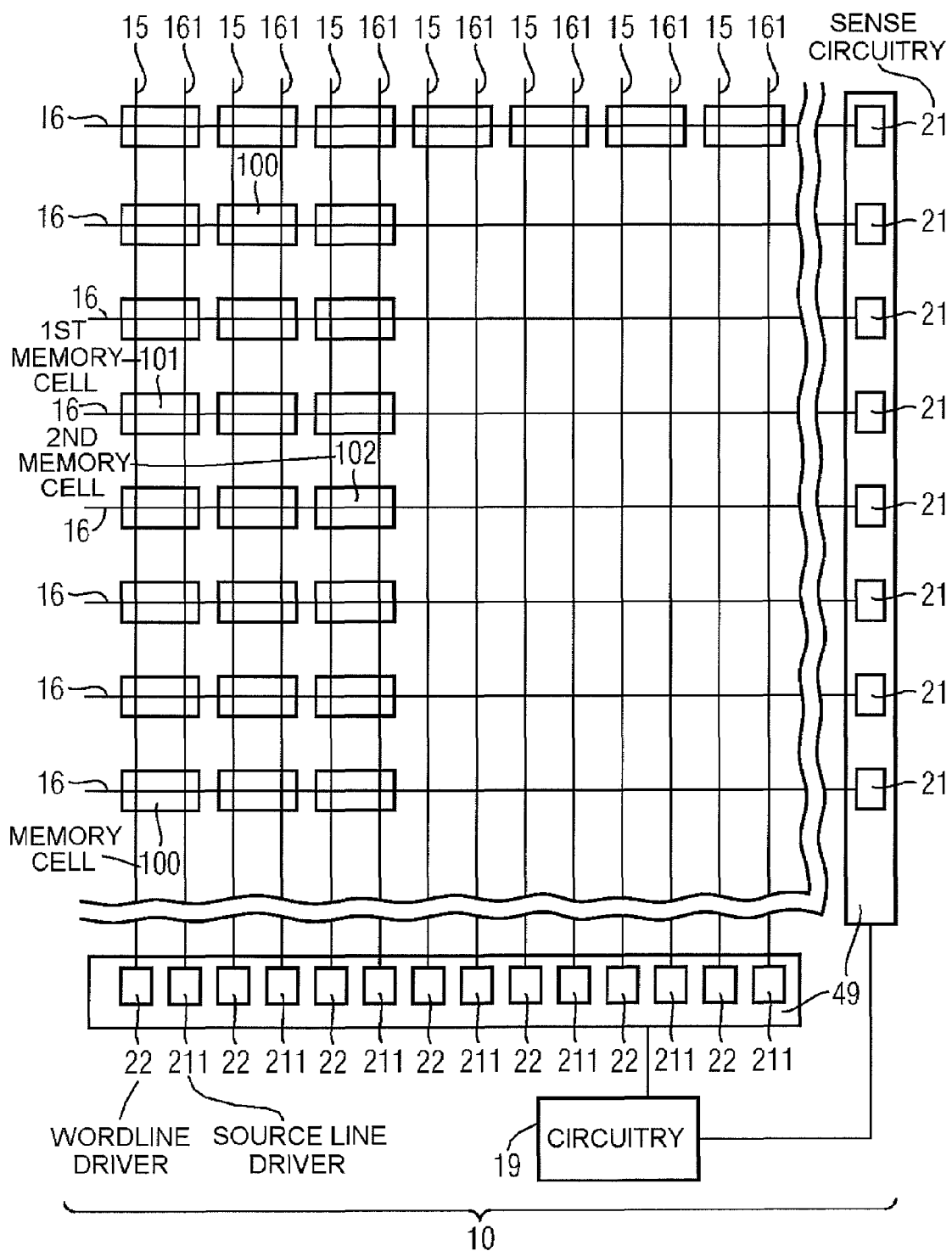

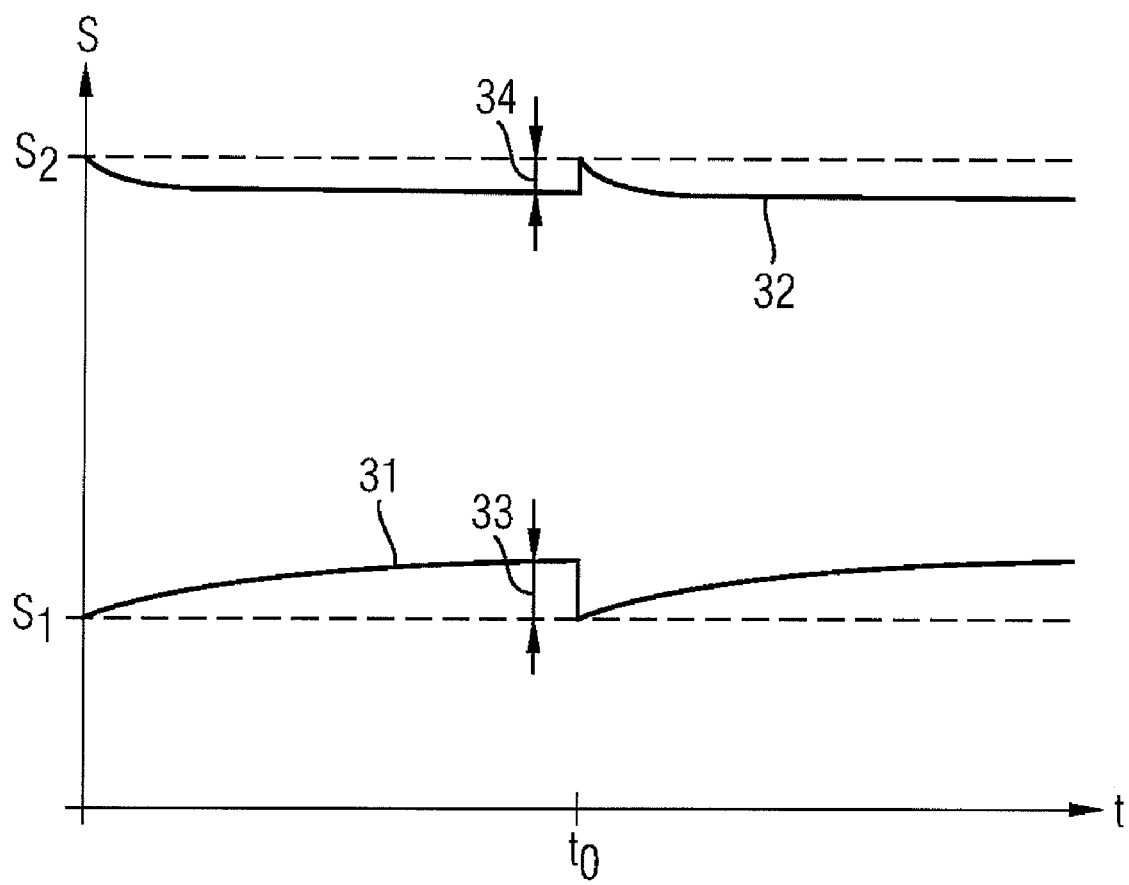

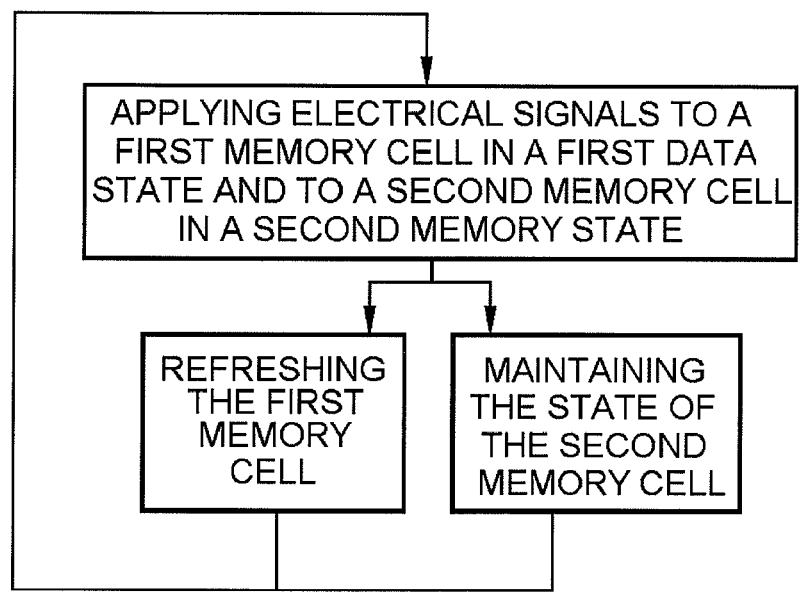
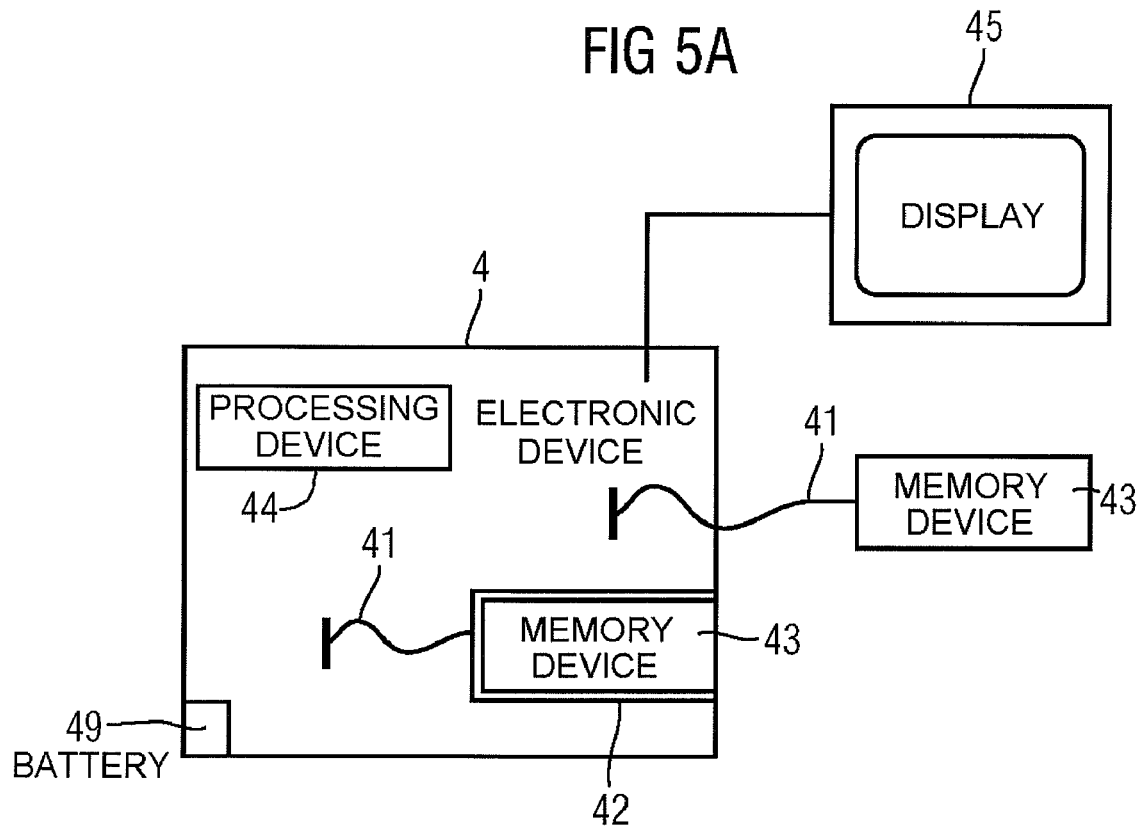

SEMICONDUCTOR DEVICE, AN ELECTRONIC DEVICE AND A METHOD FOR OPERATING THE SAME

BACKGROUND

Memory devices of a dynamic random access (DRAM) memory comprise a plurality of memory cells. Typically, the memory cells comprise a storage element, for example, a storage capacitor, as well as an access transistor. The access transistor is connected with a storage element so as to control writing or reading data into or from the storage element, respectively. For example, in a typical DRAM memory cell, the storage element is implemented as a storage capacitor and the data is represented by an electrical charge stored in the capacitor. In the commonly known DRAM cells, charges leak from the storage capacitor. As a result, the data stored in the specific memory cell gets lost. In this respect, the retention time refers to the time during which data may be recognizably stored in a memory cell. In order to store data for a time which is longer than the retention time, it is necessary to perform a refresh operation.

In commonly known memory devices, data may be refreshed by reading the stored data and by re-writing the data into the memory cell.

Among the various attempts to improve DRAM devices, efforts are made in order to improve the retention time characteristics of memory cells. Moreover alternative methods of refreshing the data stored in the memory cell are searched. In particular, it is attempted to reduce the power consumption required for a refreshing operation is reduced.

SUMMARY

A semiconductor memory device is described herein comprising circuitry coupled to a plurality of memory cells with transistors. A method is also described herein relating to operation of such a memory device. The circuitry is configured to change a potential of a body of the transistor to a degree depending on a charging state of the body. A gate electrode of the transistor is maintained in a non-addressed state.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

FIG. 1A shows an equivalent circuit diagram of an exemplary memory device;

FIG. 1B shows an equivalent circuit diagram of a memory cell;

FIG. 2A shows an equivalent circuit diagram of another exemplary memory device;

FIG. 3C shows a timing diagram of states stored in a memory cell;

FIG. 4 shows a flow chart illustrating a method according to an exemplary embodiment; and FIGS. 5A to 5C show exemplary electronic devices that may comprise the memory device according to an exemplary embodiment.

The elements of the drawings are not necessarily to scale relative to each other. Like reference numbers designate corresponding similar parts.

DETAILED DESCRIPTION

Figure 2B:
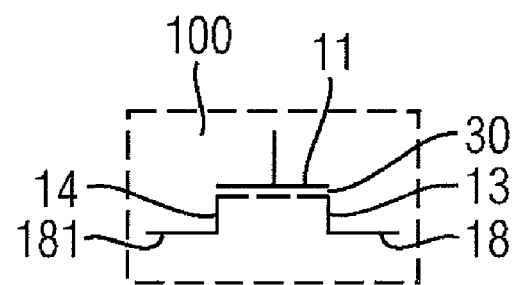
FIG. 2B shows an equivalent circuit diagram of a memory cell present in the memory device shown in FIG. 2A.

In the following detailed description reference is made to the accompanying drawings which form a part hereof and in which are illustrated by way of illustration specific embodiments in which the invention may be practiced. In this regard, directional terminology such as "top", "bottom", "front", "back", "leading", "trailing" etc. is used with reference to the orientation of the figures being described. Since components of embodiments of the invention can be positioned in a number of different orientations, the directional terminology is used for purposes of illustration and is in no way limiting. Is to be understood that other embodiments may be utilized and structural or logical changes may be made without departing from the scope defined by the claims.

FIG. 1A shows an equivalent circuit diagram of a memory device 10 according to an exemplary embodiment. The semiconductor memory device shown in FIG. 1A comprises a plurality of memory cells 100. For example, the plurality of memory cells may include a first memory cell 101 and a second memory cell 102 wherein the first memory cell is in a first data state and the second memory cell is in a second data state. The first data state may be representative of a first charge which is provided in a corresponding one of the memory cells, for example, a first memory cell 101. Moreover, the second data state may be representative of a second charge which is provided in the second memory cell 102. As is clearly to be understood, each of the memory cells may adopt more than two data states (e.g., four or five). Nevertheless, for the sake of simplicity, only two data states will be explained herein. Any of the memory cells 100 may be in the first or the second data state. As will be explained below with reference to FIG. 1B, each of the plurality of memory cells may comprise a transistor and the transistor may comprise a gate electrode. The memory device 10 may further comprise circuitry 19 which is coupled to the plurality of memory cells. The circuitry 19 may be coupled to the memory cells 100 via a first support portion 49. For example, the circuitry 19 may apply substantially the same electrical signals to the first memory cell 101 as well as to the second memory cell 102. In this respect, the term "substantially the same electrical signals" means that an electrical signal is applied to a specific line (e.g., a bitline 16). Accordingly, this electrical signal is also applied to all the memory cells 100 which are coupled to the specific bitline. Hence, upon application of an electrical signal no difference is made as to whether the memory cell is one of the first memory cells 101 or one of the second memory cells 102.

Upon application of the electrical signals to the first and the second memory cells, the first memory cell 101 may be refreshed and the second memory cell 102 may maintain the second data state. Moreover, the application of electrical signals to the first and the second memory cells does not comprise substantially changing a voltage which is applied to the corresponding gate electrode of the transistors. Accordingly, the voltage which is applied to the gate electrodes is essentially maintained at a predetermined value. Consequently, the addressing state of the gate electrode of the transistor is not changed. Accordingly, the gate voltage of the transistor may be changed to an amount which is smaller than an amount by which the transistor becomes addressed. In other words, the gate electrode is substantially maintained at the voltage value at which the first and the second memory cells 101, 102 were held before performing the refresh operation. In the equivalent circuit diagram, by way of example, wordlines 15 and bitlines 16 are shown. It is to be understood, the memory device may comprise further conductive lines extending in an arbitrary direction. For example, the further conductive lines may be arranged in an array. Since the voltage which is applied to the gate electrode is substantially maintained at a predetermined value, all the memory cells which are connected with a specific bitline 16 may be refreshed. Hence, it becomes possible to refresh a plurality of memory cells.

In other words, the circuitry 19 which is coupled to the memory cells is configured to change a potential of a body of the transistor to a degree which depends on a charging state of the body. Upon application of corresponding signals an addressing state of the gate electrode of the transistor is maintained. Accordingly, the potential of the body of the transistor which will be explained later is changed. Furthermore, the degree of this change depends on the charging state of the body. Accordingly, if the body is in a first charging state, the potential of the body is changed to a different degree in comparison with a body which is in a different charging state. The circuitry is configured to generate signals, which are applied to at least one portion selected only from the group consisting of a source and a drain portion of the transistors. Accordingly, the signals are applied to a source or a drain portion of the transistors while the gate voltage is not substantially changed.

In other words, the memory device comprises memory cells 100, wordlines 15 and bitlines 16. Each of the memory cells 100 comprises a transistor and each of the transistors comprises a gate electrode. Data may be written into a selected memory cell 100 by activating a selected wordline 15 and transmitting an appropriate signal via a corresponding bitline 16. Reading data may be performed by setting a selected bitline 16 at a predetermined potential and sensing the resulting current flow. The plurality of memory cells includes a first memory cell 101 and a second memory cell 102, the first memory cell 101 being in a first data state and the second memory cell 102 being in a second data state. The first data state is different from the second data state. The memory device further comprises circuitry 19 which is coupled to the plurality of wordlines 15 and bitlines 16 to apply substantially the same electrical signals to the first and to the second memory cells 101, 102. Upon application of the electrical signals, the first memory cell 101 is refreshed and the second memory cell 102 substantially maintains the second data state. Moreover, the application of an electrical signal does not comprise substantially changing a voltage applied to the wordlines 15. Accordingly, as is shown in FIG. 1A, the circuitry 19 for applying electrical signals to the first and the second memory cells 101, 102 so as to perform a refreshing operation, may be connected with a first support portion 49 which is only connected with the bitlines 16 of the memory device. For example, the circuitry 19 may be configured so as to not address the wordlines 15.

In other words, when the electrical signals are applied to the first and the second memory cells 101, 102, majority carriers are removed from the first memory cell 101 and the majority carriers are substantially maintained in the second memory cell. In this respect "substantially maintained" may refer to a stage in which some carriers may be removed. However, the second data state may be explicitly read from the corresponding memory cell.

FIG. 1B shows an equivalent circuit diagram of the memory cell which may form part of the memory device shown in FIG. 1A. As is shown in FIG. 1B, the memory cell 100 may comprise a transistor 12. The transistor 12 comprises a first doped portion 13 and a second doped portion 14. For example, the first doped portion 13 may form the source portion and the second doped portion 14 may form the drain portion of the transistor 12. The first doped portion 13 is connected via a bitline contact 18 with a corresponding bitline 16. The transistor further comprises a gate electrode 11 which is configured to control an electrical current flowing from the first to the second doped portion 13, 14 and vice versa. The gate electrode 11 is connected with a corresponding wordline 15. The memory cell 100 may further comprise a storage device 20 such as a storage capacitor. Nevertheless, as will be explained in the following, the transistor 12 itself may be implemented as a storage transistor which is adapted to store a charge representing data.

FIG. 2A shows an exemplary equivalent circuit diagram of a memory device 10 according to another embodiment. As can be seen, the memory device comprises a plurality of wordlines 15 and bitlines 16. Moreover, the device comprises source lines 161 which may be arranged in parallel with respect to the wordlines 15. Accordingly, the source lines 161 may intersect the bitlines 16. At a point of intersection of source lines and bitlines 16, a memory cell 100 is formed. For example, the memory cell 100 may be implemented in a manner as will be explained with reference to FIG. 2B or 2C. Writing data may be accomplished by activating a bitline, a corresponding source line and a corresponding wordline. Moreover, reading may be accomplished by activating a corresponding bitline and a corresponding source line 161 or a corresponding wordline. For example, reading or writing may be accomplished by setting the source line to an elevated voltage while maintaining the corresponding bitline 16 at a low voltage. Alternatively, reading or writing may be accomplished by setting a corresponding bitline 16 to an elevated voltage while maintaining a corresponding source line 161 at a low voltage. Accordingly, the circuitry 19 is configured to cause a predetermined potential difference between a selected bitline and a selected source line to select a memory cell which is coupled to the selected bitline and the selected source line. Nevertheless, the specific mechanism of reading and writing data is not limited to the mechanism described above but may also be of any type known to one of ordinary skill in the art.

The memory device 10 further comprises a support portion in which wordline drivers 22 for activating corresponding wordlines 15 are disposed. Furthermore, source line drivers 211 may be disposed in the support portion, the source line drivers 211 being connected with corresponding source lines 161. Sense circuitry 21 may be connected with corresponding bitlines 16 for sensing a transmitted signal.

Nevertheless, in addition, bitline drivers may be connected with corresponding bitlines and sense circuitry may be as well connected with the source lines 161. Moreover, the source lines may be connected with each other and may be held at the same potential. For example, the source lines may be implemented as a common plate, for example if the transistors are formed as vertical transistors which will be explained herein below. Accordingly, conductive lines are provided so that individual memory cells may be selected by activating corresponding conductive lines. Moreover, the circuitry may comprise appropriate drivers and sense circuitry so as to perform the desired operations. The array of memory cells 100 comprises a first memory cell 101 as well as a second memory cell 102. For example, the first memory cell 101 may be in a first data state and the second memory cell 102 may be in a second data state. The data state of a corresponding memory cell may be recognized by measuring a resistance value of the specific memory cell, as will be explained later. For example, this resistance may be measured by using a current source. To be more specific, the resistance value may be measured by setting a specific current and determining the voltage which is necessary for forcing the set current. Accordingly, the sense circuitry 21 may comprise a current source. Accordingly, the semiconductor memory device shown in FIG. 2A may comprise a plurality of memory cells 100, including a first memory cell 101 and a second memory cell 102. Each of the memory cells may comprise a transistor. Wordlines may be coupled to gate electrodes of the transistors. The memory device may further comprise bitlines which may be coupled to first doped portions of the transistors as well as source lines which may be coupled to second doped portions of the transistors. The memory device further may comprise circuitry 19 which is coupled to the memory cells. The circuitry 19 may be configured to apply substantially the same electrical signals to the first memory cell which is in a first data state and to the second memory cell which is in a second data state. Any of the memory cells 100 may be in the first or second data state. Moreover, as is clearly to be understood, any of the memory cells may as well be in a further data state, for example, a third, fourth or fifth data state. Nevertheless, for the sake of simplicity in the following specification only two different data states are explained.

Upon application of the electrical signals, the first memory cell is refreshed and the second memory cell substantially maintains the second data state. The first data state is representative of a first charge provided in a corresponding memory cell and the second data state is representative of a second charge provided in a corresponding memory cell. The electrical signal which is applied to a memory cell in order to perform a refresh operation comprises substantially maintaining the voltage applied to a wordline. As a result, no memory cell is addressed. Accordingly, when this refresh operation is performed, the addressing state of a gate electrode of a transistor which is refreshed is maintained. In other words, the gate electrode of the transistor is maintained in a non-addressing state. Accordingly, the gate electrode is set to a voltage which lies outside a range in which the transistor is addressed. To be more specific, the gate voltage may be changed to a small degree in which the addressing state of the transistor is not changed. By way of example, the electrical signals may comprise setting all or selected ones of the source lines at a high voltage while maintaining the bitlines at a low voltage. By way of further example, the electrical signal may as well comprise setting all or selected ones of the bitlines at a high voltage while maintaining the source lines at a low voltage. The refresh operation is performed without selecting a specific memory cell. Accordingly, all the memory cells which are assigned to the specific source line, which is at the predetermined voltage, are refreshed. Likewise, all the memory cells which are assigned to the specific bitline which is set at a predetermined voltage are refreshed. For example if a source line is set at a high value, all the memory cells which are connected with this source line are refreshed. Hence, by applying one signal, a plurality of memory cells is refreshed.

Accordingly, the circuitry is configured to perform a self-refresh operation of the memory device while maintaining the transistors at a non-addressed state. Such a self-refresh operation may be performed during the normal operation of the memory device. The term "self-refresh" means that the circuitry applies electrical signals to the memory device comprising a first memory cell which is in a first data state, and to a second memory cell which is in a second data state. Upon application of the electrical signals the first memory cell is refreshed and the second memory cell maintains the second data state. Moreover, as has been explained above, each of the transistors is maintained at a non-addressed state. As a consequence, such a refresh operation may be performed at a high speed with low power consumption, since a plurality of memory cells is refreshed when a specific bitline or source line is set to the predetermined voltage. Moreover, the refresh operation may be performed in an easier way since it may not be necessary to apply a voltage to the wordline which may have a large capacity.

In this respect, the term "non-addressed state" or "non-selected state" refers to a state of a transistor in which a gate voltage is applied to the gate. The gate voltage lies outside a range which is used to address a transistor or a memory cell. Accordingly, an addressing state of the gate electrode of the transistor is maintained. Accordingly, the gate voltage which is applied to the transistor is not changed but maintained. Nevertheless, a specific voltage may be applied to the source or the drain portion of the transistor. Accordingly, the signals are applied to at least one portion selected only from the group consisting of a source and a drain portion of the transistors. Accordingly, signals are applied to the source or the drain portion but not to the gate electrode. Moreover, "maintaining the gate voltage" means that the gate voltage is not changed, as is for example shown in the lower portion of FIG. 3A.

FIG. 2B shows an equivalent circuit diagram of a transistor which may embody the memory cell 100 forming part of the memory device shown in FIG. 2A. As is shown, the transistor comprises first and second doped portions 13, 14. The first doped portion 13 may be connected via a bitline contact 18 with a corresponding bitline and the second doped portion 14 may be connected via a source line contact 181 with a corresponding source line 161. The transistor further comprises a gate electrode 11 which may be connected with a corresponding wordline. A channel is formed between the first and the second doped portions 13, 14. The channel 29 is insulated from the gate electrode 11 by a corresponding gate dielectric 30. As has been briefly mentioned above, data may be written into the memory cell 100 by setting one of the doped portions 13, 14 at a high value while setting the other of the doped portions 13, 14 at a low value. The high voltage may be applied to either the first or the second doped portion by setting the bitline 18 or the source line 181 at a corresponding high voltage. Since according to an exemplary embodiment it can be arbitrarily chosen whether the bitline 18 or the corresponding source line 181 is set at a high voltage, in the transistor itself no difference is made between the two doped portions. Nevertheless, during operation, the doped portion at which a high voltage is applied is referred to as the drain portion, the other portion being referred to as the source portion.

Figure 2C:
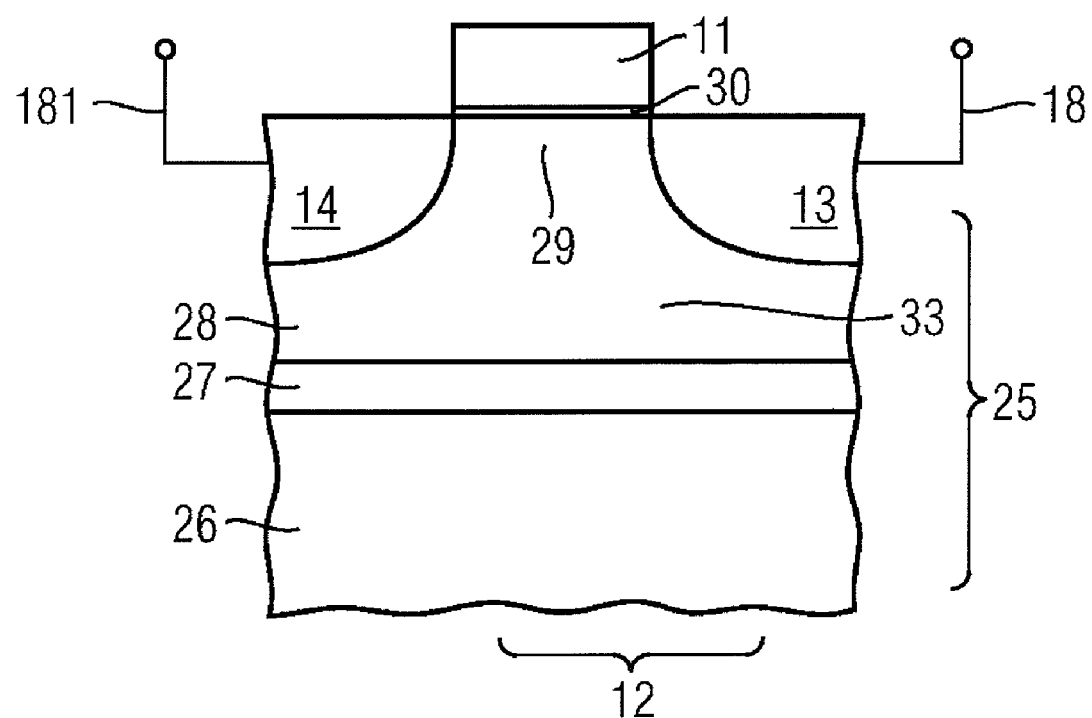
FIG. 2C shows an exemplary cross-sectional view of a memory cell.

FIG. 2C shows an exemplary cross-sectional view of a memory cell 100 which is implemented as a transistor 12, which may form part of the memory device 10 shown in FIG. 2A. As is shown in FIG. 2C, the transistor may be an electrically floating body transistor. The transistor 12 shown in FIG. 2C comprises a first and a second doped portion 13, 14. A body region 33 is disposed between the first and the second doped portions 13, 14. The transistor 12 is formed in an SOI (silicon on insulator) substrate 25. For example, such an SOI substrate may comprise a semiconductor carrier on which an insulating layer such as a silicon oxide layer 27 is formed, followed by a mono-crystalline silicon layer 28.

In the embodiment shown in FIG. 2C, the body 33 is electrically floating. Accordingly, when a corresponding voltage is applied to the first and second doped portions 13, 14, the depletion regions of the doped portions will insulate the body 33 from its surroundings, so that substantially no external control of the body voltage will be effected. Nevertheless, a transistor comprising an electrically floating body may be implemented in an arbitrary manner. By way of example, such a transistor may be any kind of transistor comprising a vertical channel in which the transistor body may be insulated due to a depletion region. Specific examples comprise a surrounding gate transistor or a double gate transistor and others. The floating body transistors comprise fully and partially depleted floating body transistors. Accordingly in such floating body transistor, the body potential may be influenced by providing charges in the body 33. For example, a charge may be generated in the body of such a transistor by applying predetermined voltage pulses between the gate electrode and the drain portion and between the source and the drain portion of the transistor. The body portion may be p- or n-doped. In this respect, an NMOS transistor refers to a transistor in which the body portion is p-doped, whereas a PMOS transistor refers to a transistor in which the body portion is n-doped. In an NMOS transistor the majority carriers are holes, whereas in a PMOS transistor the majority carriers are electrons.

In the following description, a logic high or state "1" corresponds to an increased concentration of majority carriers in the body region relative to an unprogrammed device and/or a device that is programmed with a logic low or state "0". In contrast, a logic low or state "0" corresponds to a reduced concentration of majority carriers in the body region relative to an unprogrammed device and/or a device that is programmed with a logic high or state "1". Nevertheless, as is clearly to be understood, the transistor may be in more than two programming states, for example, each of the programming states corresponding to a predetermined number of carriers.

For example, a positive charge may be generated and stored in the body 33 of an NMOS transistor via the application of a voltage between the first doped portion and the second doped portion when in its conductive state. In this case, the voltage difference between the first and the second doped portions generates electron-hole pairs by impact ionization. The electrons are then removed to the second or the first doped portions, and the holes are stored in the body 33 of the transistor 12. Likewise, in a PMOS transistor, a negative charge is generated and stored in the body.

Conventionally, reading has been performed by applying a small drain bias and a gate bias above the transistor threshold voltage so as to determine the threshold voltage of the transistor. Depending on the programming state of the transistor, the threshold voltage has been at a large or a low value resulting in a different current state.

The transistor 12 shown in FIG. 2C has a comparative short channel length, so that the transistor may be represented by a bipolar transistor. By way of example, the channel length may be less than 250 nm or less than 130 nm. For accessing the programming state of the transistor 12, source/drain characteristics may be measured without addressing a corresponding transistor by applying a suitable gate voltage. Nevertheless, the source/drain characteristics may as well be measured while applying a gate voltage. For example, a logical "1" may be recognized from the source/drain characteristics indicating that the transistor may not be operated in an off-state. In contrast, a source/drain characteristics representing a transistor in a logical "0" state may be driven in an off-state. Accordingly, the programming state of the transistor 12 may be accessed by measuring a resistance or voltage/current characteristics. For example, the resistance may be measured by forcing a constant current and measuring the voltage needed for achieving this current. Accordingly, the corresponding sense circuitry may comprise a current source. If a sense circuitry comprising a current source is employed, the power consumption of the memory device may be further decreased.

Nevertheless, as is clearly to be understood, the resistance may as well be measured by applying a constant voltage and measuring the resulting current. Accordingly, the corresponding sense circuitry may as well comprise a voltage source.

Figure 3A:
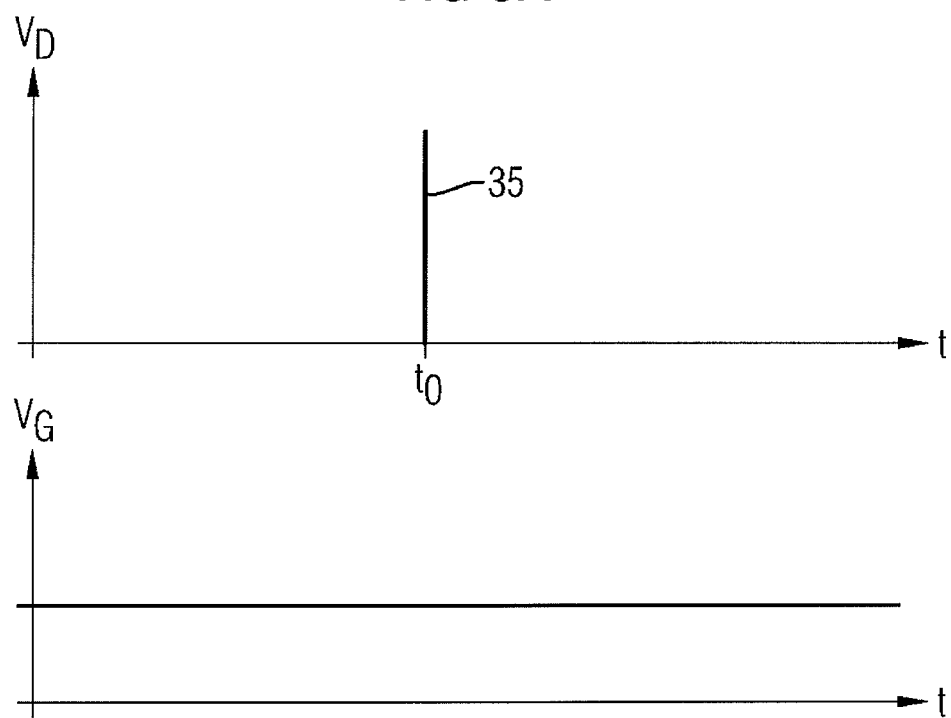
FIG. 3A shows exemplary voltage diagrams.
Figure 3B:
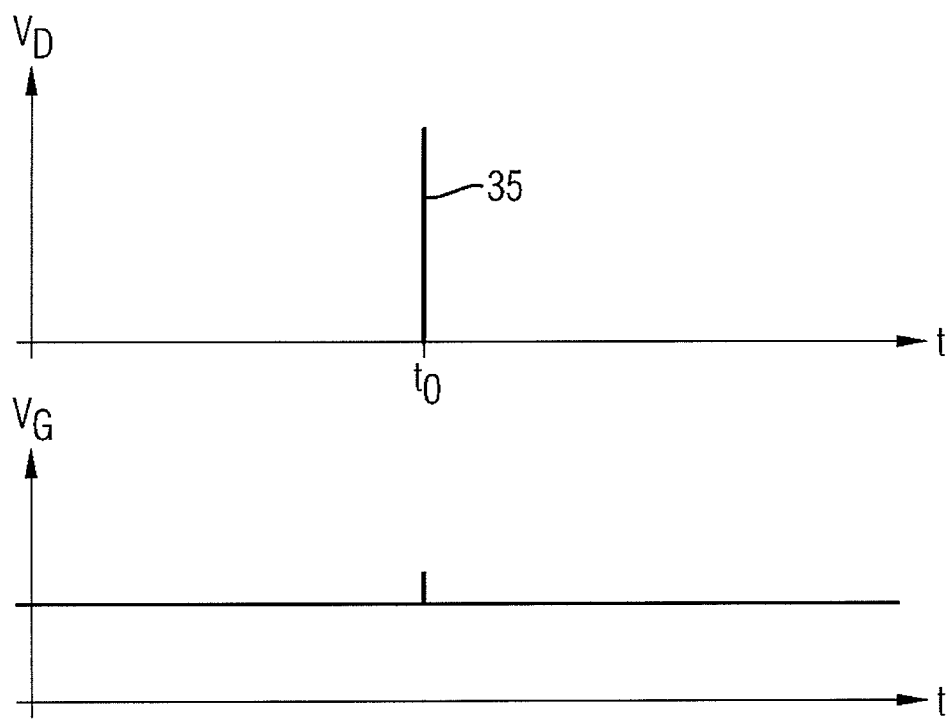
FIG. 3B shows further exemplary voltage diagrams.

The circuitry 19 which is shown in FIG. 2A, for example, is configured to apply electrical signals to the memory device 10. For example, the signals which are shown in FIG. 3A may be applied. For example, a positive voltage pulse may be applied at the drain junction while a source junction is set to a low value, for example grounded. At the same time, the voltage which is applied to the gate electrode remains unchanged. The gate voltage may have an arbitrary value. For example, if the transistor has a gate length of about 150 nm, a drain voltage of more than 2 V, for example, about 2.7 V may be applied, while setting the source junction to 0 V. For a shorter gate length, also the drain voltage may decrease. For example, if the gate length is approximately 30 nm, the drain voltage may be about 1 Volt or more. A pulse width may be, for example, 1 µs or less, and typically, for example, 1 ns. FIG. 3B shows a further exemplary voltage diagram. As can be seen, the voltage which is applied to the drain junction is approximately equal to the voltage shown in FIG. 3A. Nevertheless, the gate voltage is slightly changed. However, the change of the gate voltage lies outside a range which changes the addressing state of the corresponding transistor.

Depending on the accumulation state of the transistor body, the holes may be partially removed from the body. To be more specific, the holes are removed from the body which is in a "0" state, whereas substantially no holes are removed from the body of a cell which is in a "1" state. An exemplary timing diagram of the voltage applied to the drain junction is shown in FIG. 3A. Accordingly, the voltage pulse is applied at time $t_0$. For example, if a cell is in a "1" state, upon application of the electrical signal an impact ionization may generate an electrical current. Holes and electrons may be generated, the electrons being trapped in the gate dielectric. Upon turning off the electrical signal, the holes in the transistor body may recombine with the electrons trapped in the gate dielectric. As a result, substantially no holes are removed from the transistor body, thus maintaining the "1" state. If a cell is in a "0" state, upon application of the electrical signal no current may be generated due to the potential barrier between the body and the source junction. Accordingly, no holes may be generated but electrons may be trapped in the gate dielectric adjacent to the drain junction. When the voltage is set off, the electrons trapped in the gate dielectric may recombine with the holes present in the transistor body. As a result, the holes may be removed from the transistor body, thus refreshing the "0" state of the memory cell.

For given voltage conditions, the pulse width and the frequency are chosen in a way that the resulting carrier loss of the refresh operation is larger than the leakage current integrated over one refresh circle, i.e., the amount of charge by which the transistor body is charged. Due to the high voltage which is applied to the corresponding bitline or source line, the gate induced leakage current (GIDL) is raised. Accordingly, even during the refresh operation the transistor body may be charged. Accordingly, the charge which is removed during one refresh operation should be larger than the charge which is brought into the transistor body due to the GIDL.

This is illustrated in FIG. 3C representing the charge states of two memory cells. By way of example, in FIG. 3C S1 represents a first data state, whereas S2 represents a second data state. Due to a gate induced leakage current (GIDL) majority carriers may leak into the transistor body so as to increase the amount of majority carriers in the transistor body. As a result, the data state 31 of the first memory cell gets deteriorated. Likewise, some of the majority carriers stored in the second memory cell are removed, thus deteriorating the second data state 32. Accordingly, for example, the amount of deterioration 33 of the data state 31 of the first memory cell may be more severe than the degree of deterioration 34 of the data state 32 of the second memory cell. Upon application of an electrical signal 35 to the first and the second memory cells 101, 102, the first memory cell which is in the first data state S1, is refreshed as has been explained above. Moreover, the second memory cell which is in the second data state S2 substantially maintains the second data state 32 as has been explained above. Nevertheless, as is clearly to be understood, according to another embodiment also the second data state may be refreshed while maintaining the first data state, depending on the type of memory cell. Moreover, the first data state as well as the second data state may be equally refreshed. Moreover, a plurality of the signals may be applied to the memory cells so that the refreshing method comprises several sub-steps. Moreover, the method may as well comprise applying signals so as to refresh the memory cells which are in the first data state and, thereafter, applying signals so as to refresh the memory cells which are in the second data state.

FIG. 4 shows an exemplary flow chart of a method according to an exemplary embodiment. For example, a method of operating a memory device may comprise applying electrical signals to a first memory cell which is in a first data state and to a second memory cell which is in a second data state. For example, applying the electrical signal may comprise maintaining a voltage applied to a gate electrode of transistors of the corresponding memory cells. For example, substantially the same electrical signals may be applied to the first memory cell and to the second memory cell. During the method of operating the memory device, the first memory cell is refreshed and the second memory cell is maintained in the second state. Thereafter, the refreshing operation may be repeated.

As has been described above, the specification relates to a method of operating a memory device. The memory device comprises a plurality of memory cells, each of the memory cells comprising a transistor, wordlines coupled to gate electrodes of the transistors, bitlines coupled to first doped portions of the transistors, and source lines coupled to second doped portions of the transistors. The method comprises applying a predetermined voltage to a selected source line or a selected bitline to perform a self-refresh operation of all the memory cells coupled to at least one of the source lines or to at least one of the bitlines. Accordingly, for example, all the memory cells which are coupled to a selected one of the source lines or to a selected one of the bitlines may be refreshed if a corresponding signal is applied to the corresponding source line or to the corresponding bitline.

Moreover, the specification relates to a method for operating a memory device. The memory device comprises a plurality of memory cells that are configured to adopt a selected one of at least first and second data states, the first data state being different from the second data state, each of the memory cells comprising a transistor including a body. The method comprises applying an electrical signal to memory cells to change a potential of the body of the transistor in an amount depending from the data state of the memory cell.

A predetermined memory cell may be selected by causing a predetermined potential difference between a selected bitline and a selected source line, the selected bitline and the selected source line being coupled to the selected memory cell.

FIG. 5A schematically shows an electronic device according to an exemplary embodiment. As is shown in FIG. 5A, the electronic device may comprise an interface 41 and a memory device 43 which is adapted to be interfaced by the interface 41. The memory device may be any of the memory devices as has been explained above. For example, the memory device 43 may be interconnected with the interface 41. Nevertheless, as is obvious to one of ordinary skill in the art, any other kind of interface between the electronic device and the memory device 43 may be implemented. For example, the memory device 43 may be housed by the electronic device 4.

As a further example, the electronic device 4 may comprise a slot 42 into which the memory device 43 may be inserted and electrically connected with the interface 41. The electronic device 4 may further comprise a processing device 44 for processing data. In addition, the electronic device 4 may further comprise a display 45 for displaying data. The electronic device may further comprise components. Examples of the electronic device include: a computer (e.g., a personal computer or a notebook computer), a server, a router, a game console (e.g., a video game console or a portable video game console), a graphic card, a personal digital assistant, a digital camera, a cell phone, an audio system such as any kind of music player or a video system.

Figure 5B:
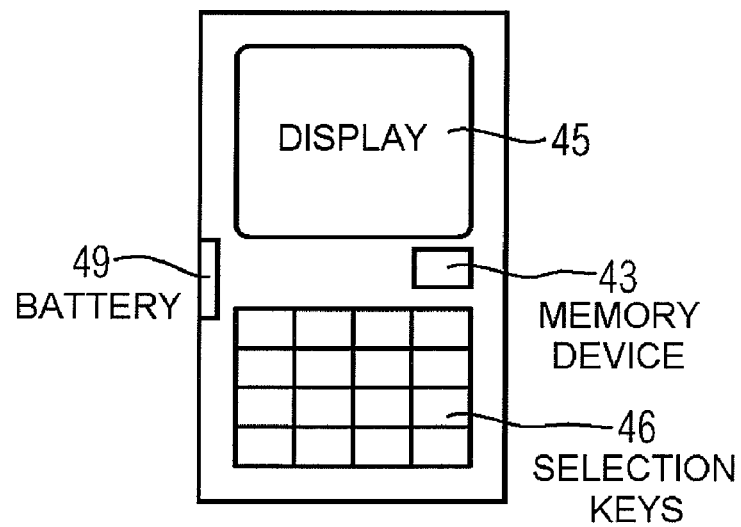

Due to the low power consumption of the refresh operation as has been explained above, the memory device may be advantageously employed in portable systems which may be operated via a battery 49, for example, a re-chargeable battery. Accordingly, the electronic system may, for example, be any kind of portable electronic system comprising any of the devices as mentioned above. As is shown in FIG. 5B, such a portable electronic device may comprise a display 45, selection keys 46, as well as a memory device 43. As is obvious to one of ordinary skill in the art, the electronic system may be exemplified by any kind of device in which digital data is processed, transmitted or stored.

Figure 5C:
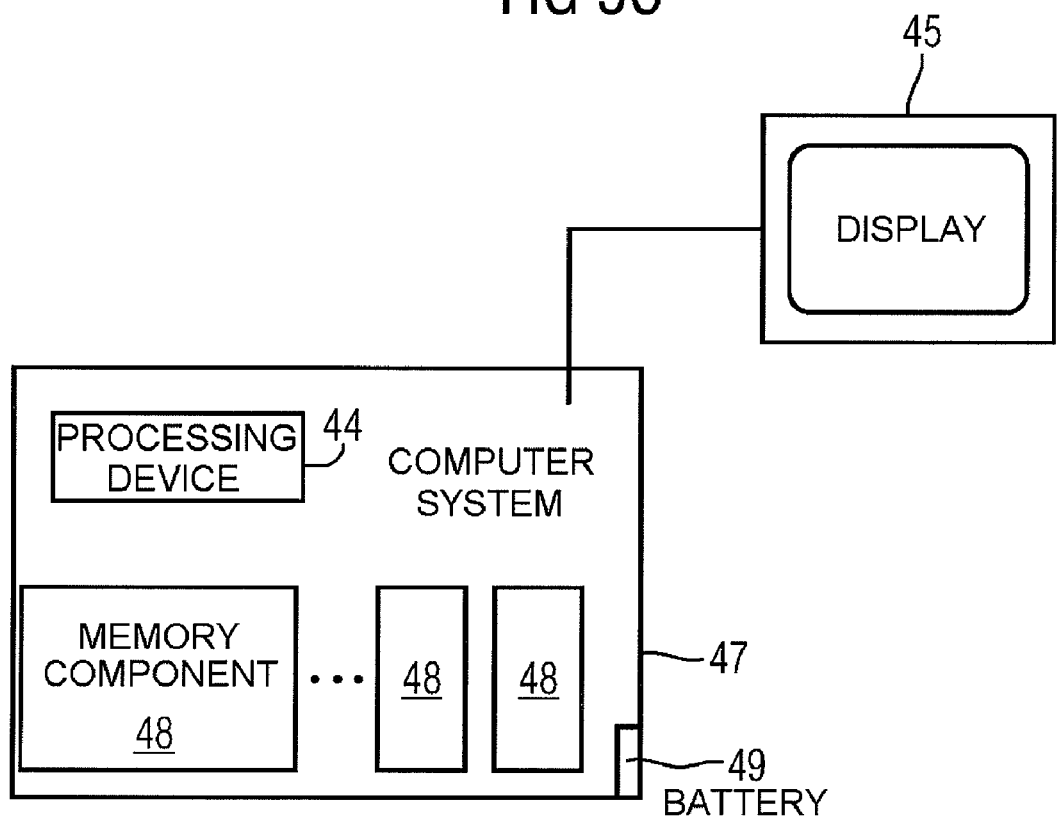

FIG. 5C shows a personal computer system 47 according to an exemplary embodiment. As is shown, the personal computer system 47 comprises one or more memory components 48, each including a plurality of memory devices. The personal computer system 47 may further comprise a processing device 44 for processing data and a display 45 for displaying data as well as other components.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A semiconductor memory device comprising:
   a plurality of memory cells, each of the memory cells including a transistor; and
   circuitry coupled to the memory cells, wherein the circuitry is configured to change a potential of a body of the transistor of each memory cell to a degree depending on a charging state of the body while maintaining a gate electrode of the transistor in a non-addressed state.

2. The semiconductor memory device of claim 1, wherein the transistor of each memory cell comprises an electrically floating body transistor, and the body of the transistor comprises an electrically floating body region configured to adopt data states representative of an amount of charges stored in the body region.

3. The semiconductor memory device of claim 2, wherein the electrically floating body transistor of each memory cell is an N-channel type transistor.

4. The semiconductor memory device of claim 3, wherein the circuitry is configured to apply electrical signals to a doped portion of a corresponding one of the transistors, and the electrical signals comprise a positive voltage pulse.

5. The semiconductor memory device of claim 2, wherein the electrically floating body transistor is a P-channel type transistor.

6. The semiconductor memory device of claim 5, wherein the circuitry is configured to apply electrical signals to a doped portion of a corresponding one of the transistors, and the electrical signals comprise a negative voltage pulse.

7. The semiconductor memory device of claim 2, wherein:
the charging state of the body of the transistor of each memory cell depends on an amount of carriers stored in the body; and
upon application of the signal, the carriers are removed from at least one first memory cell in a first charging state, and the carriers are substantially maintained in at least one second memory cell in a second charging state, the first charging state being different from the second charging state.

8. The semiconductor memory device of claim 7, wherein the circuitry further comprises data sensing circuitry coupled to the plurality of memory cells, and the data sensing circuitry is configured to determine data states of the memory cells.

9. The semiconductor memory device of claim 8, wherein the electrically floating body transistor of each memory cell is configured to generate a current between a first and second source/drain portion in response to a read control signal transmitted by the data sensing circuitry, the current being representative of the data state of the memory cell.

10. The semiconductor memory device of claim 7, wherein the electrically floating body transistor of each memory cell is an N-channel type transistor.

11. The semiconductor memory device of claim 10, wherein the electrical signals comprise a positive voltage pulse applied to one of the source/drain portions of a corresponding one of the transistors.

12. The semiconductor memory device of claim 7, wherein the electrically floating body transistor of each memory cell is a P-channel type transistor.

13. The semiconductor memory device of claim 12, wherein the electrical signals comprise a negative voltage pulse applied to one of the source/drain portions of a corresponding one of the transistors.

14. The semiconductor memory device of claim 7, wherein the circuitry is operable to simultaneously apply the electrical signals to the first and second memory cells.

15. The semiconductor memory device of claim 7, wherein the memory cells are arranged in rows and columns and the circuitry is configured to simultaneously apply the electrical signals to memory cells of at least one row or column.

16. The semiconductor memory device of claim 7, wherein the circuitry is configured to simultaneously apply the electrical signals to all the memory cells of the semiconductor memory device.

17. The semiconductor memory device of claim 1, wherein the circuitry further comprises a data sensing circuitry coupled to the memory cells, the data sensing circuitry being configured to determine data states of the memory cells.

18. The semiconductor memory device of claim 1, wherein the circuitry is configured to generate signals to be applied to one of a source region and a drain region of the transistor of each memory cell.

19. An electronic device comprising the semiconductor memory device of claim 1.

20. The electronic device according to claim 19, wherein the electronic device is selected from the group consisting of: a computer, a server, a router, a game console, a graphics card, a personal digital assistant, a digital camera, a cell phone, an audio system, a video system and a processing device.

21. The electronic device of claim 19, wherein the electronic device is portable.

22. The electronic device of claim 19, wherein the electronic device is battery operated.

* * * * *